(12) United States Patent
Tsao et al.

(10) Patent No.: US 10,709,027 B2
(45) Date of Patent: Jul. 7, 2020

(54) CIRCUIT BOARD MODULE AND ELECTRONIC DEVICE

(71) Applicant: PEGATRON CORPORATION, Taipei (TW)

(72) Inventors: Wen-Hsien Tsao, Taipei (TW); Ho-Ching Huang, Taipei (TW); Wen-Cheng Tsai, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/144,867

(22) Filed: Sep. 27, 2018

(65) Prior Publication Data
US 2019/0159351 A1 May 23, 2019

(30) Foreign Application Priority Data
Nov. 21, 2017 (TW) .............................. 106140251 A (51) Int. Cl.
| H05K 1/18 | (2006.01) |
| H05K 5/00 | (2006.01) |
| H05K 5/02 | (2006.01) |
| H05K 5/06 | (2006.01) |
| H05K 3/34 | (2006.01) |

(52) U.S. Cl.
CPC ........... *H05K 5/0069* (2013.01); *H05K 1/183* (2013.01); *H05K 5/003* (2013.01); *H05K 5/006* (2013.01); *H05K 5/0008* (2013.01); *H05K 5/0056* (2013.01); *H05K 5/0247* (2013.01); *H05K 5/069* (2013.01); *H05K 3/3447* (2013.01); *H05K 2201/09063* (2013.01); *H05K 2201/09754* (2013.01); *H05K 2201/10189* (2013.01); *H05K 2201/10409* (2013.01)

(58) Field of Classification Search
USPC .......................................................... 361/761
See application file for complete search history.

(56) References Cited

U.S. PATENT DOCUMENTS

| 2009/0284913 A1* | 11/2009 | Wakabayashi ........ H04L 1/0083 361/679.54 |
| 2010/0188828 A1* | 7/2010 | Takao ................... G06F 1/1613 361/759 |
| 2017/0196075 A1* | 7/2017 | Barron ................. H05K 1/0204 |

FOREIGN PATENT DOCUMENTS

| CN | 205378150 | 7/2016 |
| TW | M327149 | 2/2008 |
| TW | M379787 | 5/2010 |

OTHER PUBLICATIONS

"Office Action of Taiwan Counterpart Application," dated Mar. 26, 2019, p. 1-p. 4.

* cited by examiner

*Primary Examiner* — Andargie M Aychillhum
(74) *Attorney, Agent, or Firm* — J.C. Patents (57) ABSTRACT

A circuit board module for being assembled to a case is provided. The circuit board module includes an electronic connector and a circuit board. The electronic connector is fixed to the circuit board. The circuit board has at least one first slot. The at least one first slot is configured for a fixing element to pass through and for the circuit board to be assembled to a case. The size of the at least one first slot allows the fixing element to move in a direction parallel to a surface of the circuit board in the at least one first slot. An electronic device having the circuit board module is also provided.

10 Claims, 9 Drawing Sheets

CIRCUIT BOARD MODULE AND ELECTRONIC DEVICE

CROSS-REFERENCE TO RELATED APPLICATION

This application claims the priority benefit of Taiwan application serial no. 106140251, filed on Nov. 21, 2017. The entirety of the above-mentioned patent application is hereby incorporated by reference herein and made a part of this specification.

BACKGROUND

Technical Field

The disclosure relates to a circuit board module and an electronic device; more particularly, the disclosure relates to a circuit board module and an electronic device using the circuit board module.

Related Art

General industrial electronic devices may be placed indoors or outdoors to meet different requirements for electrical connections. When the electronic devices are placed outdoors, the electronic devices may be exposed to the harsh environment, and dust, moisture, or other fine substances in the air may enter the electronic devices from slits or gaps on the sides of electronic connectors, which may pose a negative impact on the operation of the electronic devices and reduce the service lives of the electronic devices.

According to an existing method of preventing moisture and dust, the case bodies of the electronic devices are assembled to the electronic connectors, and protection washers are installed between the electronic connectors and the case bodies of the electronic devices, so as to better block dust, moisture, or other fine substances from entering into the electronic devices from slits or gaps on the sides of electronic connectors. However, applying such a method leads to two possible outcomes. First, the protection washers do not perform satisfactory functions of preventing moisture and dust. Second, when the circuit boards are assembled to the cases, the solder joints between the electronic connectors and the circuit boards may encounter the issue of solder crack.

SUMMARY

The disclosure provides a circuit board module and an electronic device to prevent an issue of solder crack of a solder joint between an electronic connector and a circuit board.

In an embodiment of the application, a circuit board module for being assembled to a case is provided. The circuit board module includes an electronic connector and a circuit board. The electronic connector is fixed to the circuit board. The circuit board has at least one first slot. The at least one first slot is configured for a fixing element to pass through to assemble the circuit board to be assembled to the case. A size of the at least one first slot allows the fixing element to move in a direction parallel to a surface of the circuit board in the at least one first slot.

According to an embodiment, the fixing element is for moving around the electronic connector as a center in the at least one first slot.

According to an embodiment, the circuit board includes at least one second slot, and a shape of the at least one first slot is identical to or different from a shape of the at least one second slot.

According to an embodiment, the shape of the at least one first slot and the shape of the at least one second slot include an arc shape, an elliptical shape, or a circular shape.

According to an embodiment, a distance between the at least one first slot and the electronic connector is greater than a distance between the at least one second slot and the electronic connector.

According to an embodiment, the size of the at least one first slot is for being adjusted with the distance between the at least one first slot and the electronic connector and a rotation angle of the electronic connector, and a size of the at least one second slot is for being adjusted with the distance between the at least one second slot and the electronic connector.

According to an embodiment, the electronic connector includes a body, a supporting portion located at one end of the body, a connection port located at the other end of the body, a threaded portion disposed at the body, a nut screwed on the threaded portion, and a sealing ring disposed at the supporting portion. The supporting portion is held between the circuit board and the case, the sealing ring is held between the supporting portion and the case, and the case is held between the nut and the supporting portion.

In an embodiment of the application, an electronic device includes a case and a circuit board module. The case includes a case body, at least one fixing portion, and at least one fixing element. The at least one fixing portion is disposed at the case body. The at least one fixing element is fixed to the at least one fixing portion. The circuit board module includes an electronic connector and a circuit board. The electronic connector is fixed to the circuit board and connected to the case body. The circuit board has at least one first slot. The at least one first slot is configured for the at least one fixing element to pass through to assemble the circuit board to be assembled to the case. A size of the at least one first slot allows the at least one fixing element to move in a direction parallel to a surface of the circuit board in the at least one first slot.

According to an embodiment, the electronic connector includes a nut for rotating along a fastening direction after receiving a force. When the nut rotates along the fastening direction, the case rotates together with the nut along the fastening direction, and the at least one fixing element moves around the electronic connector as a center in the at least one first slot.

According to an embodiment, the case further includes an installation portion disposed at the case body. The electronic connector includes a body, a supporting portion located at one end of the body, a connection port located at the other end of the body, a threaded portion disposed at the body, the nut screwed on the threaded portion, and a sealing ring disposed at the supporting portion. The supporting portion is held between the circuit board and the installation portion, the sealing ring is held between the supporting portion and the installation portion, and the installation portion is held between the nut and the supporting portion.

In view of the above, the circuit board module and the electronic device are provided in the disclosure to prevent the solder joint between the electronic connector and the circuit board from encountering the issue of solder crack.

To make the above features provided in one or more of the embodiments more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DETAILED DESCRIPTION OF THE EMBODIMENTS

Figure 1:
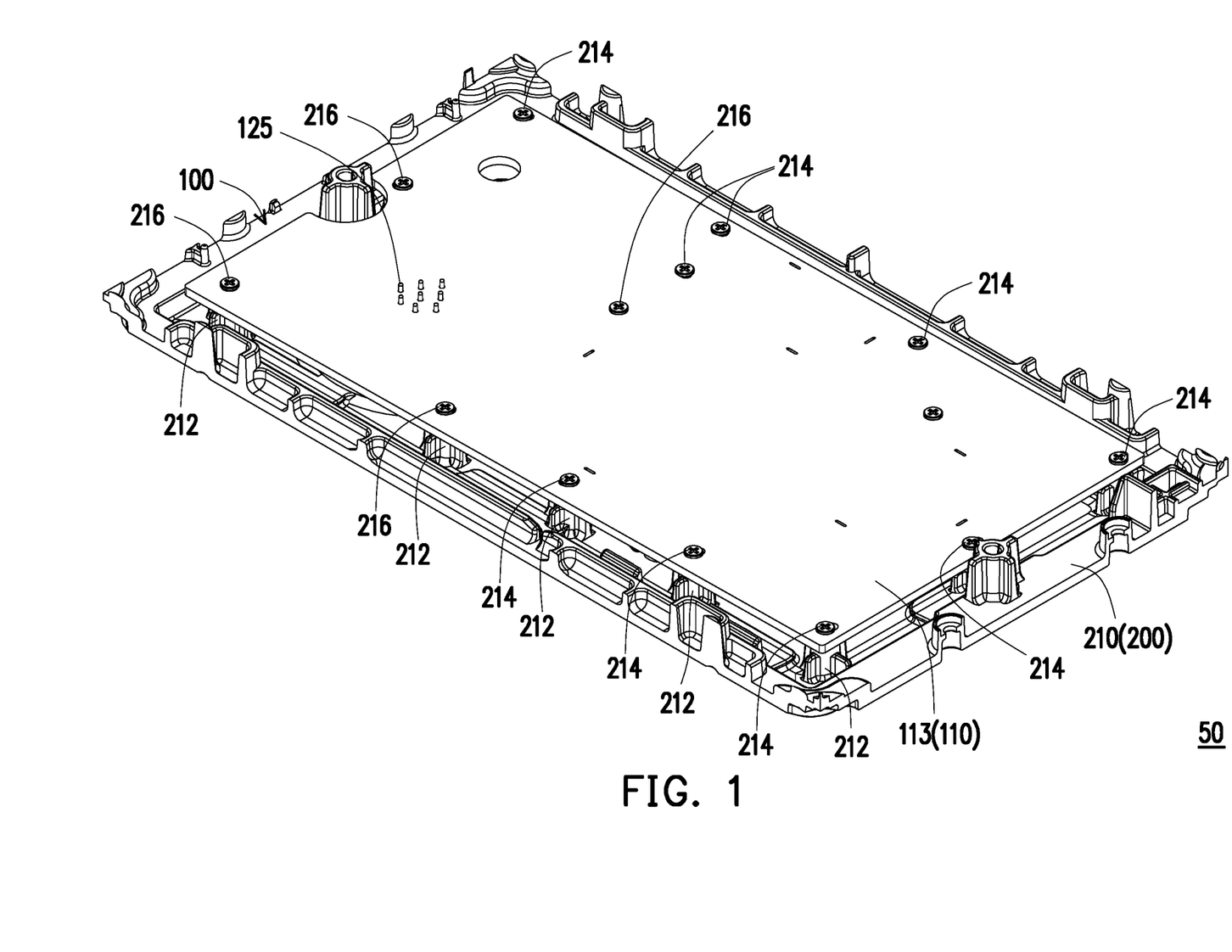
FIG. 1 is a schematic view illustrating an electronic device according to an embodiment of the application.
Figure 2:
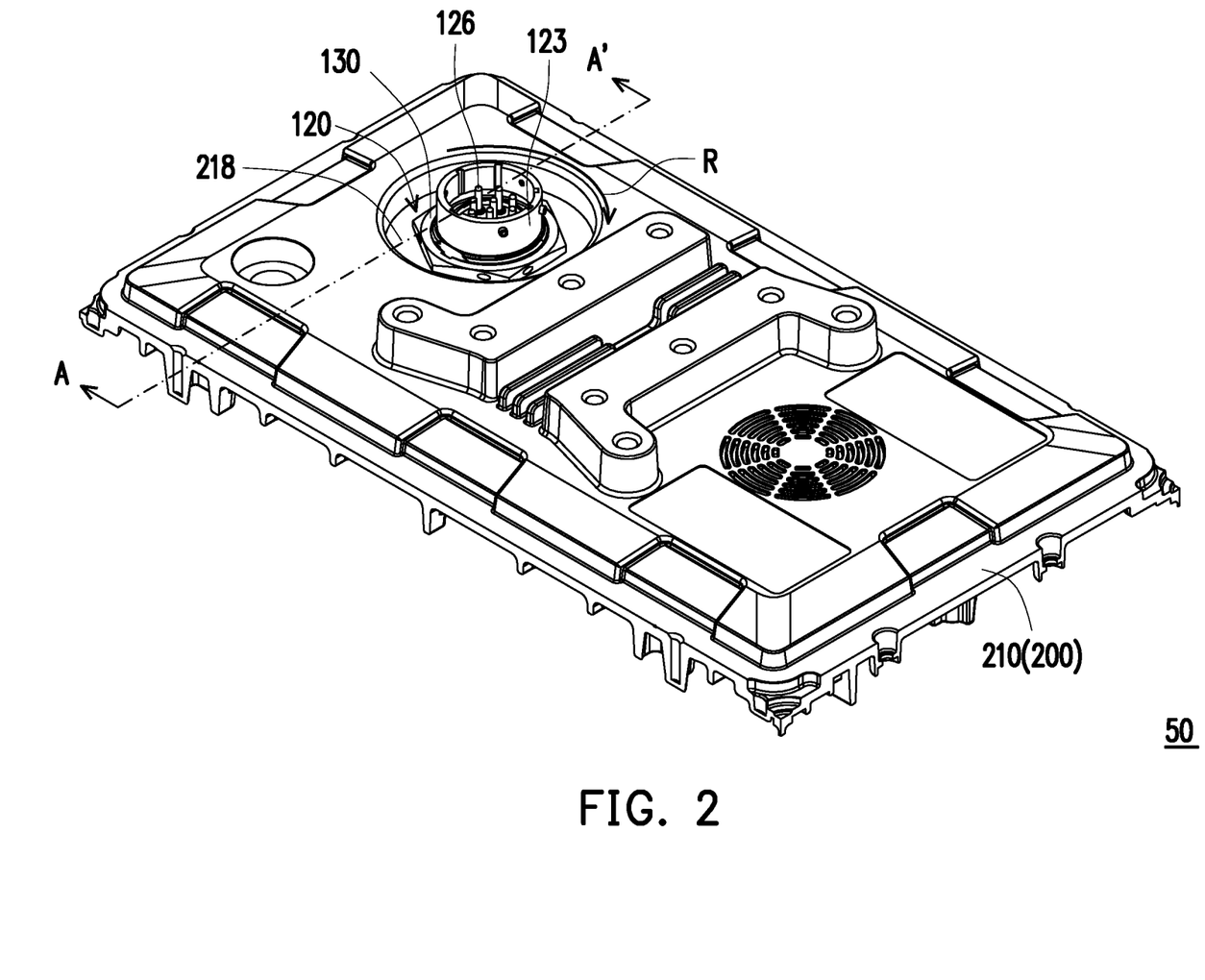
FIG. 2 is a schematic view illustrating the electronic device in FIG. 1 at another angle.
Figure 3:
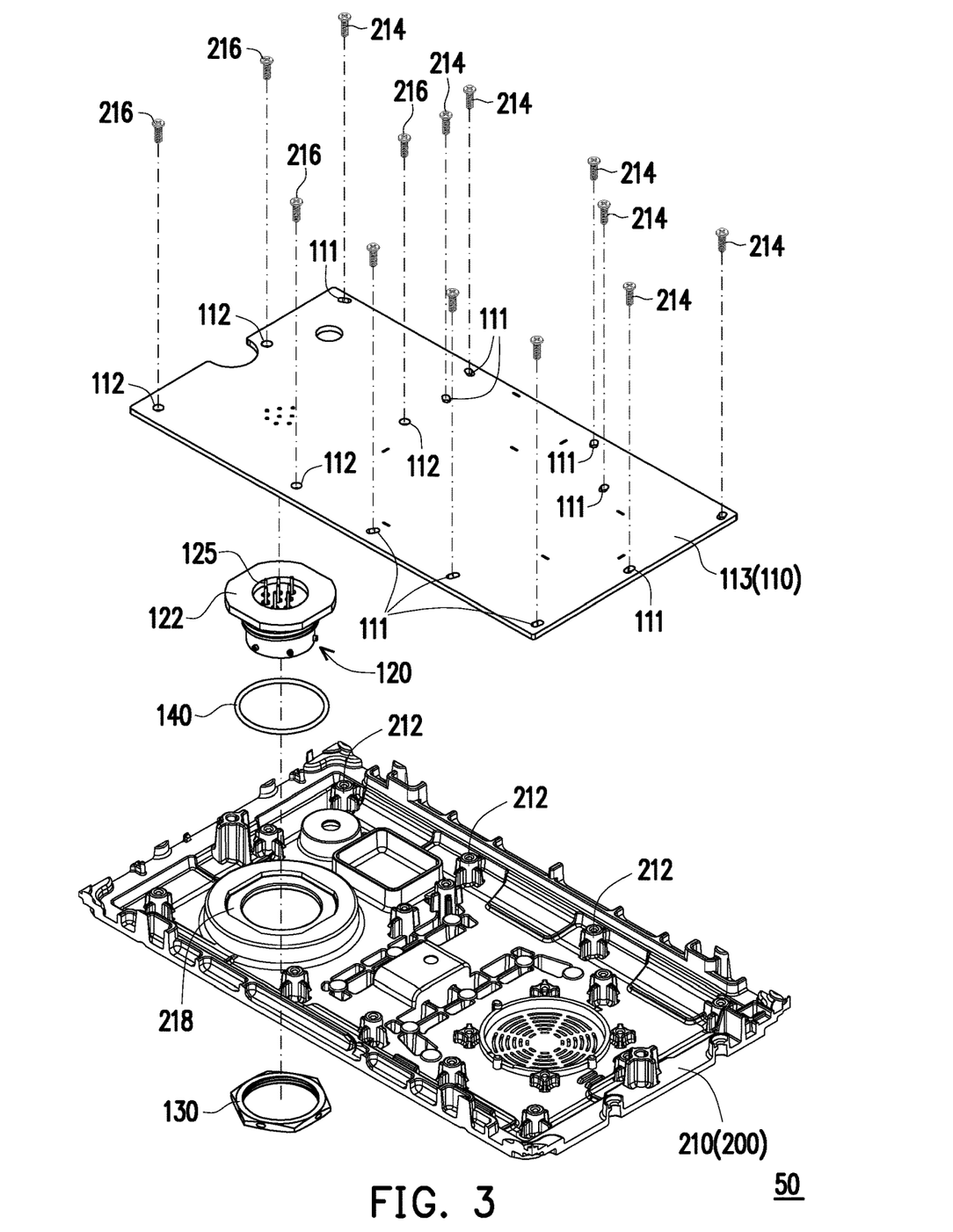
FIG. 3 is an exploded view illustrating the electronic device depicted in FIG. 1.
Figure 4:
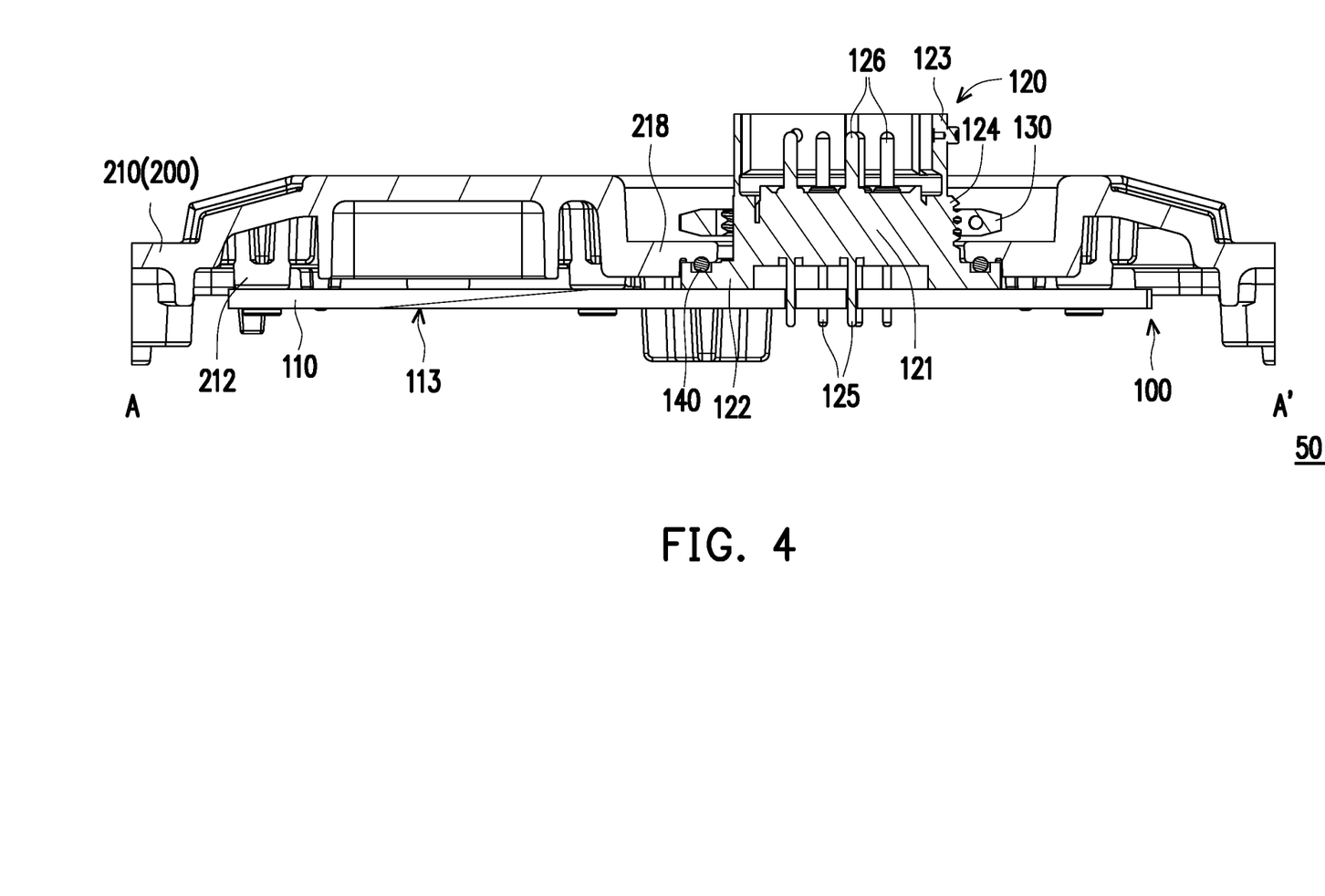
FIG. 4 is a schematic cross-sectional view illustrating the electronic device depicted in FIG. 2 along a section line A-A'.

FIG. 1 is a schematic view illustrating an electronic device according to an embodiment of the application. FIG. 2 is a schematic view illustrating the electronic device in FIG. 1 at another angle. FIG. 3 is an exploded view illustrating the electronic device depicted in FIG. 1. FIG. 4 is a schematic cross-sectional view illustrating the electronic device depicted in FIG. 2 along a section line A-A'. With reference to FIG. 1 to FIG. 3, in the present embodiment, an electronic device 50 includes a case 200 and a circuit board module 100, and the circuit board module 100 could be assembled to the case 200. The case 200 includes a case body 210, at least one fixing portion 212, at least one fixing element 214, and at least one fixing element 216. The circuit board module 100 includes an electronic connector 120 and a circuit board 110. The electronic connector 120 is fixed to the circuit board 110 and connected to the case body 210. The circuit board 110 has at least one first slot 111. The at least one first slot 111 is configured for the at least one fixing element 214 to pass through to assemble the circuit board 110 to the case 200. A size S1 (shown in FIG. 9) of the at least one first slot 111 allows the at least one fixing element 214 to move along a direction parallel to a surface 113 of the circuit board 110 in the at least one first slot 111. In the present embodiment, the number of the at least one first slot 111 is plural, and the number of the at least one fixing portion 212 and the number of the at least one fixing element 214 corresponding to the number of the at least one first slot 111 are also plural. However, the number of the at least one first slot 111, the number of the at least one fixing portion 212, and the number of the at least one fixing element 214 may also be one, respectively, which should not be construed as a limitation in the disclosure.

In the present embodiment, the at least one fixing portion 212 is disposed at the case body 210, and the at least one fixing element 214 is further fixed to the at least one fixing portion 212 of the case body 210. That is, the at least one fixing element 214 passes through the at least one first slot 111 of the circuit board 110 and is then fixed to the at least one fixing portion 212 of the case 200, so that the circuit board 110 is combined to the case 200. Besides, the at least one fixing element 214 may limit the movement of the case 200 in a direction perpendicular to the surface 113 of the circuit board 110.

In the present embodiment, the electronic connector 120 is soldered to the circuit board 110, for instance. The size S1 of the at least one first slot 111 allows the at least one fixing element 214 to move along the direction parallel to the surface 113 of the circuit board 110 in the at least one first slot 111. When the case 200 is assembled to the circuit board 110, the case 200 may rotate with respect to the circuit board 110 by a certain angle, so as to provide the case 200 with certain allowance of rotation. Thereby, stress may be prevented from being concentrated on the solder joint between the electronic connector 120 and the circuit board 110 while the case 200 is being fastened; as such, the issue of solder crack of the solder joint between the electronic connector 120 and the circuit board 110 may be avoided.

Figure 5:
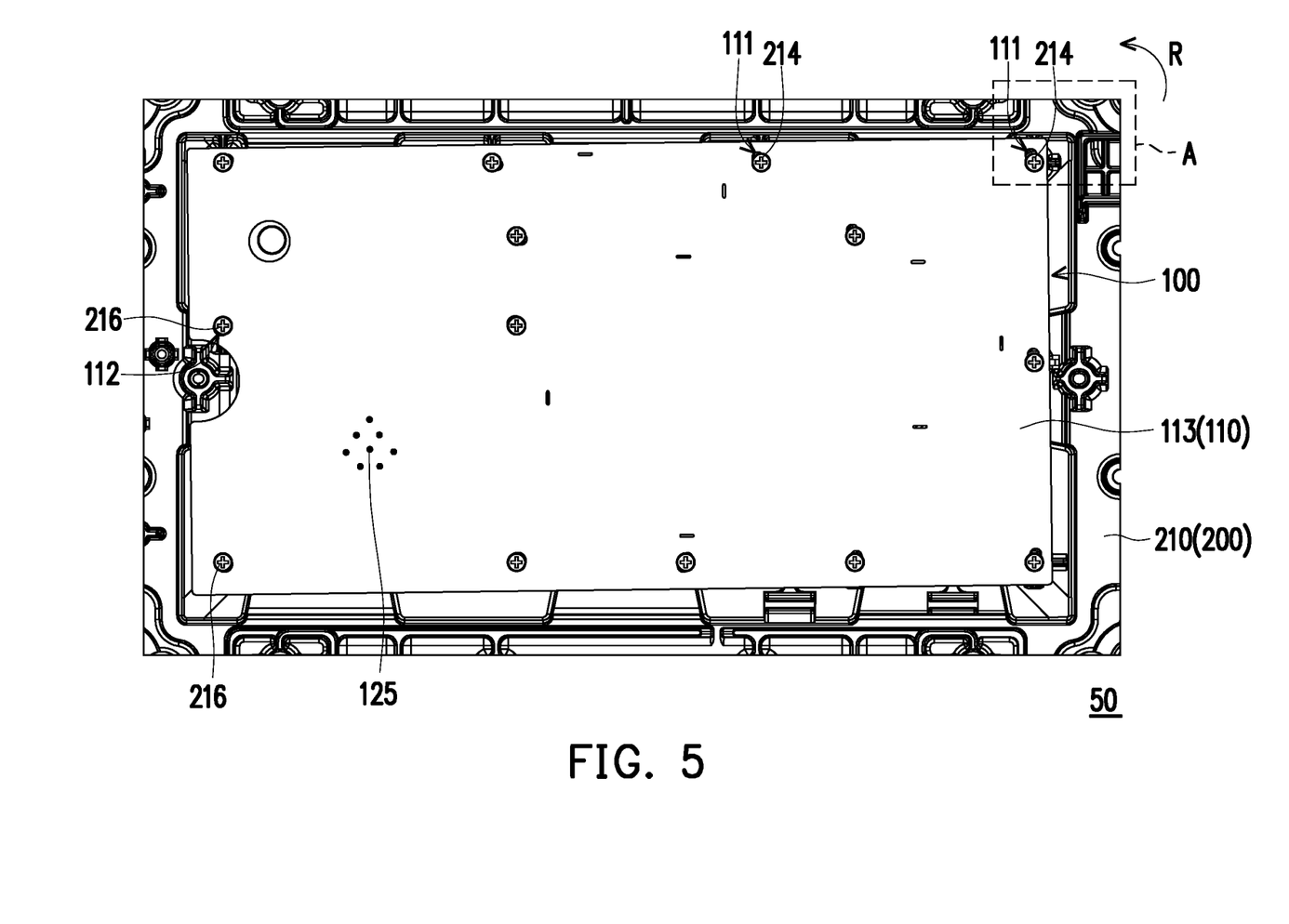
FIG. 5 is a schematic top view illustrating the electronic device depicted in FIG. 1 before the case body of the electronic device is fastened.
Figure 6:
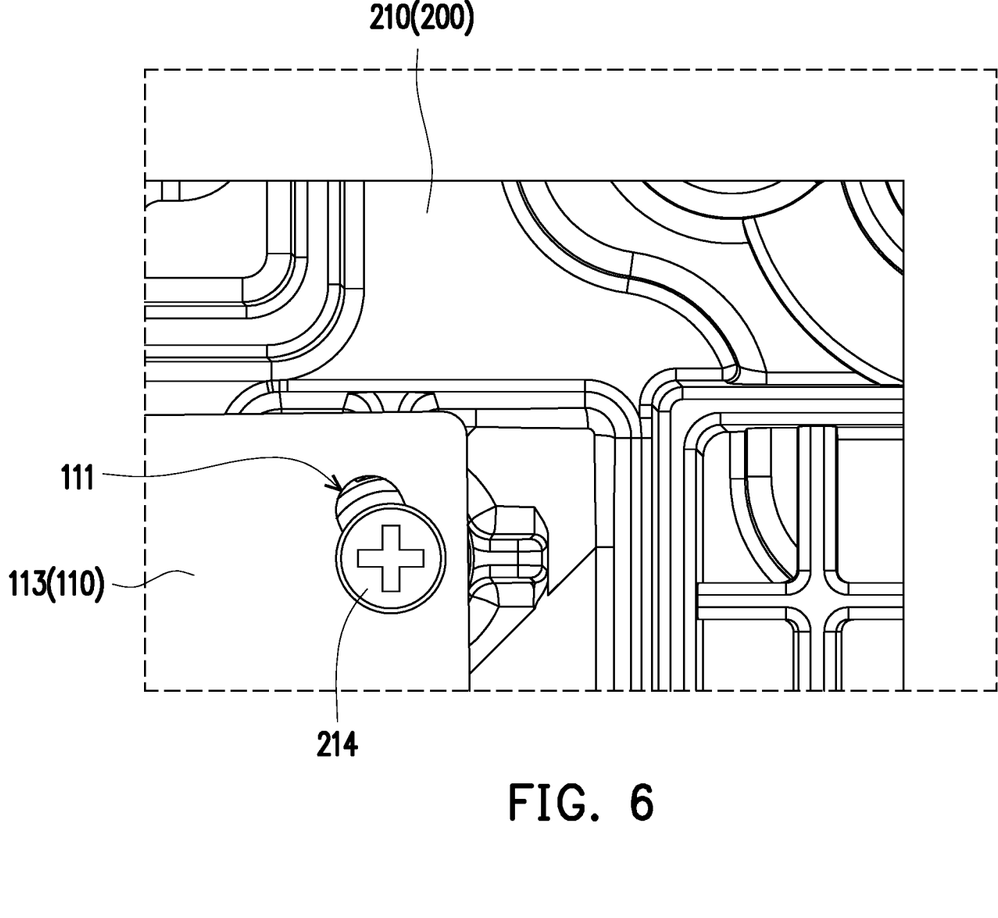
FIG. 6 is a schematic enlarged view illustrating a region A of the electronic device depicted in FIG. 5.
Figure 7:
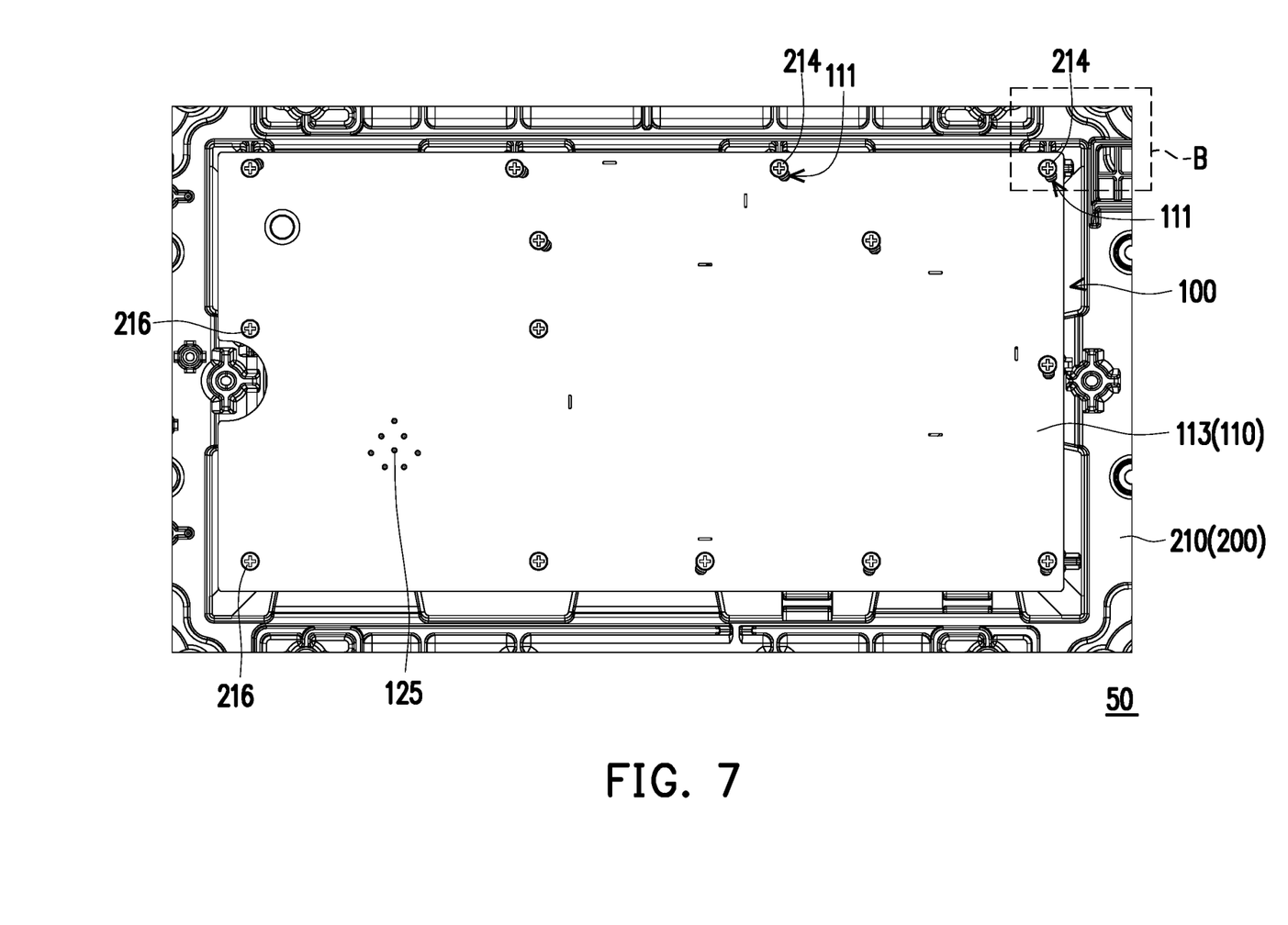
FIG. 7 is a schematic top view illustrating the electronic device depicted in FIG. 1 after the case body of the electronic device is fastened.
Figure 8:
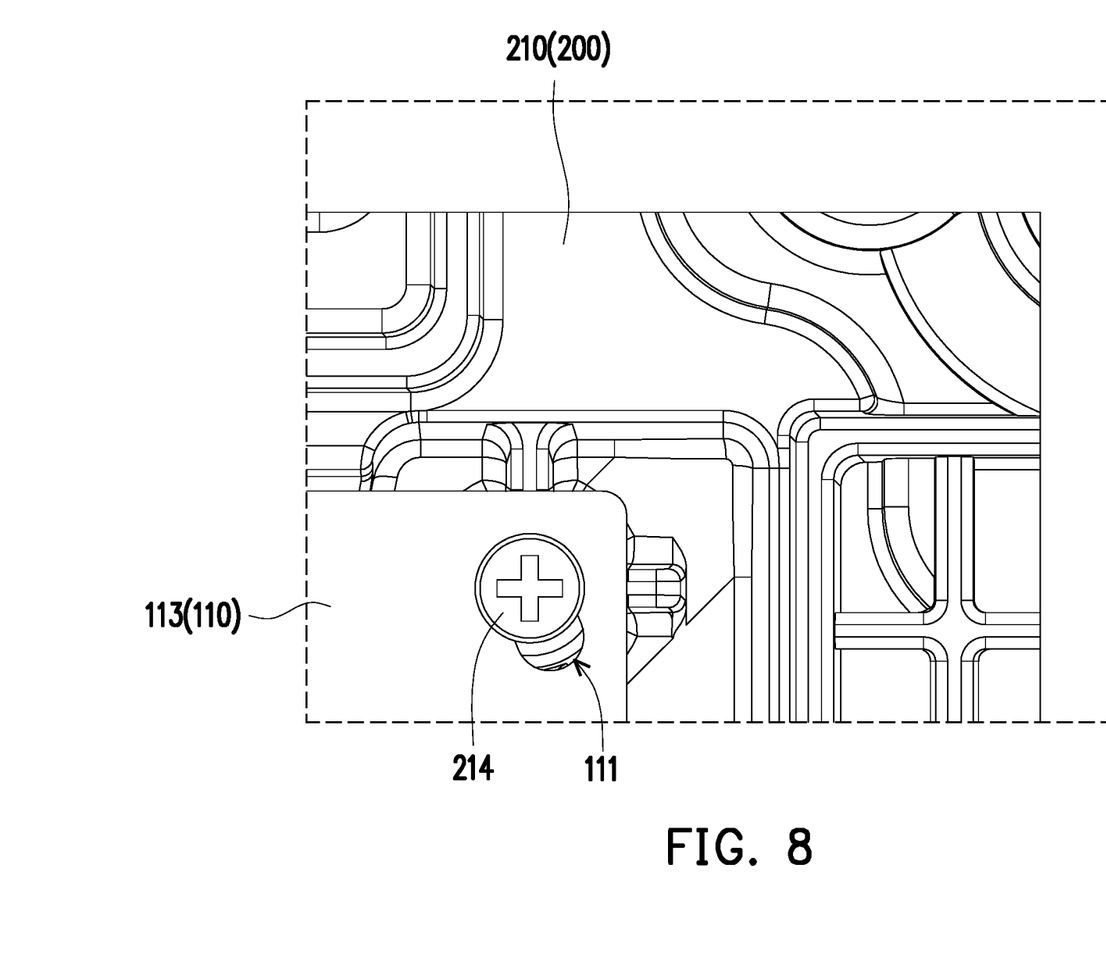
FIG. 8 is a schematic enlarged view illustrating a region B of the electronic device depicted in FIG. 7.
Figure 9:
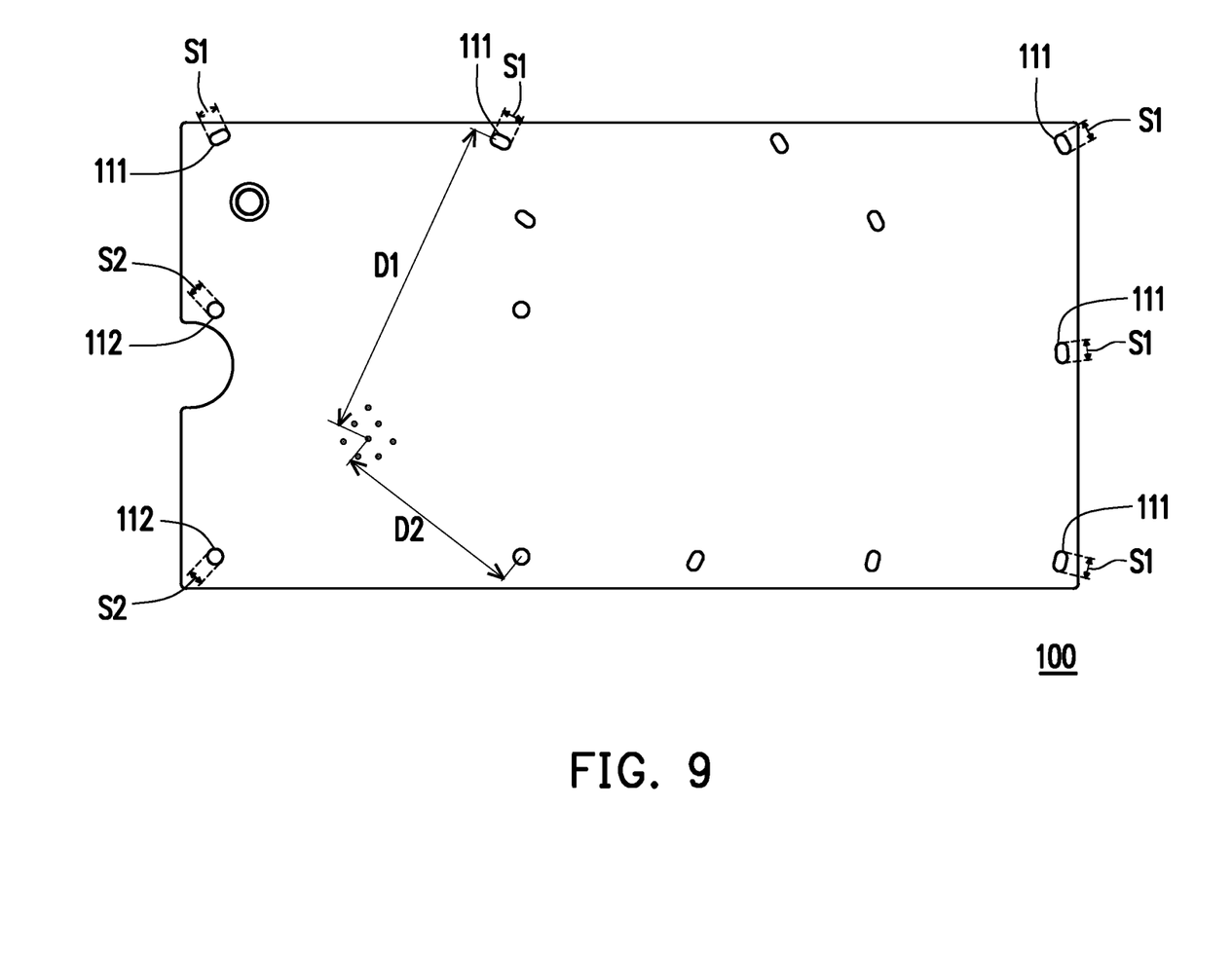
FIG. 9 is a schematic top view illustrating the circuit board module of the electronic device depicted in FIG. 1.

FIG. 5 is a schematic top view illustrating the electronic device depicted in FIG. 1 before the case body of the electronic device is fastened. FIG. 6 is a schematic enlarged view illustrating a region A of the electronic device depicted in FIG. 5. FIG. 7 is a schematic top view illustrating the electronic device depicted in FIG. 1 after the case body of the electronic device is fastened. FIG. 8 is a schematic enlarged view illustrating a region B of the electronic device depicted in FIG. 7. FIG. 9 is a schematic top view illustrating the circuit board module of the electronic device depicted in FIG. 1. With reference to FIG. 1, FIG. 3, and FIG. 9, in the present embodiment, the circuit board 110 further includes at least one second slot 112 that is configured for the at least one fixing element 216 to pass through to assemble to the case 200, and the shape of the at least one first slot 111 may be identical to or different from the shape of the at least one second slot 112. For instance, the shape of the at least one first slot 111 and the shape of the at least one second slot 112 comprise an arc shape, an elliptical shape, a circular shape, or a combination thereof. In the present embodiment, the shape of the at least one first slot 111 is elliptical, for instance, the shape of the at least one second slot 112 is circular, for instance, and a diameter of the circular second slot 112 is slightly greater than a diameter of a corresponding hole of the at least one fixing element 216. However, in other embodiment, the shape of the at least one first slot may be circular, and the shape of the at least one second slot may be the elliptical shape, the arc shape, or a combination thereof. Alternatively, the at least one first slot and the at least one second slot may both are the arc shape, the elliptical shape, or the circular shape; as long as the size S1 (shown in FIG. 9) of the at least one first slot 111 allows the at least one fixing element 214 to move along the direction parallel to the surface 113 of the circuit board 110 in the at least one first slot 111 and a size S2 (shown in FIG. 9) of the at least one second slot 112 allows the at least one fixing element 216 to move along the direction parallel to the surface 113 of the circuit board 110 in the at least one second slot 112, the shape of the at least one first slot and the shape of the at least one second slot are not limited herein.

With reference to FIG. 1 to FIG. 3 and FIG. 9, in the present embodiment, a distance D1 between the at least one first slot 111 and the electronic connector 120 is greater than a distance D2 between the at least one second slot 112 and the electronic connector 120. In the present embodiment, the distance D2 between each of the second slots 112 and the electronic connector 120 is the same; however, in other embodiments, the distance between each of the second slots and the electronic connector is not limited. The size S1 of the at least one first slot 111 is for being adjusted with the distance D1 between the at least one first slot 111 and the electronic connector 120 and the rotation angle of the electronic connector 120, and the size S2 of the at least one second slot 112 is for being adjusted with the distance D2 between the at least one second slot 112 and the electronic connector 120. For instance, the size S1 of the at least one first slot 111 may be increased together with the increase in the distance D1 between the at least one first slot 111 and the electronic connector 120. Similarly, the size S2 of the at least one second slot 112 may be increase together with the increase in the distance D2 between the at least one second slot 112 and the electronic connector 120. In the present embodiment, the size S1 of the at least one first slot 111 away from the electronic connector 120 on the circuit board 110 is larger, and the size S1 of the at least one first slot 111 close to the electronic connector 120 on the circuit board 110 is smaller.

With reference to FIG. 2 and FIG. 4, in the present embodiment, the case 200 further includes an installation portion 218 disposed at the case body 210 and configured for the electronic connector 120 to be assembled to the case body 210. In another aspect, the electronic connector 120 includes a body 121, a supporting portion 122 located at one end of the body 121, a connection port 123 located at the other end of the body 121, a threaded portion 124 disposed at the body 121, a nut 130 screwed to the threaded portion 124, and a sealing ring 140 disposed at a supporting portion 122. The supporting portion 122 is held between the circuit board 110 and the installation portion 218 of the case 210, the sealing ring 140 is held between the supporting portion 122 and the installation portion 218 of the case 210, and the installation portion 218 of the case 210 is held between the nut 130 and the supporting portion 122.

With reference to FIG. 1, FIG. 2, FIG. 4, and FIG. 9, the electronic connector 120 further includes a plurality of first conductive terminals 125 and a plurality of second conductive terminals 126 opposite to each other. The electronic connector 120 is fixed to the circuit board 110 through the first conductive terminals 125, and the second conductive terminals 126 are located in the connection port 123. For instance, the first conductive terminals 125 are soldered to the circuit board 110. In the present embodiment, the nut 130 is adapted to rotate along a fastening direction R (shown in FIG. 2 and FIG. 5) after receiving a force, the at least one fixing element 214 is adapted to move around the electronic connector 120 as a center in the at least one first slot 111, and the at least one fixing element 216 is adapted to move around the electronic connector 120 as a center in the at least one second slot 112. When the nut 130 rotates along the fastening direction R, the case 200 rotates together with the nut 130 along the fastening direction R, the at least one fixing element 214 moves around the electronic connector 120 as the center in the at least one first slot 111, and the at least one fixing element 216 moves around the electronic connector 120 as the center in the at least one second slot 112. Thereby, when the case 200 is assembled to the circuit board 110, the size S1 of the at least one first slot 111 and the size S2 of the at least one second slot 112 may provide the case 200 with certain allowance of rotation, so as to prevent solder crack of the solder joint between the electronic connector 120 and the circuit board 110 while the case 200 is being assembled to the circuit board 110.

As shown in FIG. 2, the connection port 123 provided in the present embodiment may serve to connect the electronic device 50 to an external electronic device, and the external electronic device connected by the connection port 123 is not limited herein. For instance, the connection port 123 provided in the present embodiment is a MIL-SPEC connector complying with the US military standard. More specifically, the connection port 123 may be a circular MIL-SPEC connector, e.g., a MIL-DTL-5015 connector, a MIL-DTL-12520 connector, a MIL-DTL-22992 connector, a MIL-DTL-24308 connector, a MIL-DTL-26482 connector, a MIL-DTL-32139 connector, a MIL-DTL-38999I connector, a MIL-DTL-38999II connector, a MIL-DTL-38999III connector, a MIL-DTL-38999IV connector, a MIL-DTL-83513 connector, a MIL-DTL-83527 connector, a MIL-DTL-83538 connector, a MIL-DTL-83526 connector, a MIL-C-83522 connector, a MIL-PRF-29504 connector, a MIL-PRF-28876 connector, a MIL-PRF-39012 connector, a MIL-PRF-31031 connector, a MIL-PRF-49142 connector, or a MIL-PRF-64266 connector. In the present embodiment, the connection port 123 is the MIL-DTL-38999II 8-pin connector, for instance, but the type of the connection port 123 is not limited herein. The external electronic device in actual use may be equipped with a connection port corresponding to the connection port 123 according to actual needs.

As to the assembling steps, please refer to FIG. 3. First, the first conductive terminals 125 of the electronic connector 120 are soldered to the circuit board 110. Next, the sealing ring 140 is disposed at the supporting portion 122 of the electronic connector 120. The installation portion 218 of the case 200 is then aligned to the electronic connector 120, the at least one first slot 111 and the at least one second slot 112 are respectively aligned to the at least one fixing portion 212, the at least one fixing element 214 passes through the at least one first slot 111 to fix the at least one fixing element 214 to the corresponding fixing portion 212, the at least one fixing element 216 passes through the at least one second slot 112 to fix the at least one fixing element 216 to the corresponding fixing portion 212, and the nut 130 is screwed to the threaded portion 124 of the electronic connector 120, as shown in FIG. 5.

Next, with reference to FIG. 2 and FIG. 5 to FIG. 9, the nut 130 is fastened along the fastening direction R by a tool while a torque with a certain value is applied. The nut 130 is closely attached to the installation portion 218 of the case 200. Hence, when the nut 130 rotates along the fastening direction R, the nut 130 drives the case 200 to rotate along the fastening direction R, the at least one fixing element 214 moves around the electronic connector 120 as the center in the at least one first slot 111, and the at least one fixing element 216 moves around the electronic connector 120 as the center in the at least one second slot 112. Thereby, when the circuit board 110 is assembled to the case 200, the size S1 of the at least one first slot 111 and the size S2 of the at least one second slot 112 may provide the case 200 with certain allowance of rotation, which may prevent solder crack of the solder joint between the electronic connector 120 and the circuit board 110 while the nut 130 is being rotated along the fastening direction R. Thereby, the nut 130 provided in the present embodiment may be fastened while a torque with a large value is applied, and the sealing ring 140 may be closely attached to the electronic connector 120 and the case 200, so as to improve the overall waterproof and dustproof effects of the electronic device 50. In the present embodiment, as long as the circuit board module 100 and the electronic device 50 are indeed assembled, the order of assembling the aforesaid elements is not limited herein.

To sum up, in the electronic device provided herein, when the case is assembled to the circuit board, the size of the at least one first slot and the size of the at least one second slot may provide the case with certain allowance of rotation, so as to prevent solder crack of the solder joint between the electronic connector and the circuit board while the case is being assembled to the circuit board. Thereby, the nut provided herein may be fastened while a torque with a large value is applied, and the sealing ring may be closely attached to the electronic connector and the case, so as to improve the waterproof and dustproof effects of the electronic device.

It will be apparent to those skilled in the art that various modifications and variations can be made to the structure of the present application without departing from the scope or spirit of the application. In view of the foregoing, it is intended that the disclosure cover modifications and variations of this application provided they fall within the scope of the following claims and their equivalents.

What is claimed is:

1. A circuit board module for being assembled to a case, the circuit board module comprising:
   an electronic connector; and
   a circuit board, wherein the electronic connector is fixed to a surface of the circuit board, the circuit board has at least one first slot extending along a horizontal direction parallel to the surface of the circuit board and configured for a fixing element to pass through along an inserting direction perpendicular to the horizontal direction to assemble the circuit board to the case, a size of the at least one first slot allows the fixing element to move in the at least one first slot along the horizontal direction thereof, wherein the electronic connector comprises a nut for rotating along a fastening direction after receiving a force, the nut rotates along the fastening direction, the case rotates with the nut along the fastening direction, and the at least one fixing element moves around the electronic connector as a center in the at least one first slot.

2. The circuit board module as recited in claim 1, wherein the circuit board comprises at least one second slot, and a shape of the at least one first slot is identical to or different from a shape of the at least one second slot.

3. The circuit board module as recited in claim 2, wherein the shape of the at least one first slot and the shape of the at least one second slot comprise an arc shape, an elliptical shape, or a circular shape.

4. The circuit board module as recited in claim 2, wherein a distance between the at least one first slot and the electronic connector is greater than a distance between the at least one second slot and the electronic connector.

5. The circuit board module as recited in claim 2, wherein the size of the at least one first slot is for being adjusted with a distance between the at least one first slot and the electronic connector and a rotation angle of the electronic connector, and a size of the at least one second slot is for being adjusted with a distance between the at least one second slot and the electronic connector.

6. The circuit board module as recited in claim 1, wherein the electronic connector comprises a body, a supporting portion located at one end of the body, a connection port located at the other end of the body, a threaded portion disposed at the body, a nut screwed on the threaded portion, and a sealing ring disposed at the supporting portion, the supporting portion is held between the circuit board and the case, the sealing ring is held between the supporting portion and the case, and the case is held between the nut and the supporting portion.

7. An electronic device comprising:
   a case comprising:
   a case body;
   at least one fixing portion disposed at the case body; and
   at least one fixing element fixed to the fixing portion; and
   a circuit board module comprising:
   an electronic connector; and
   a circuit board, wherein the electronic connector is fixed to a surface of the circuit board, the circuit board is connected to the case body and has at least one first slot extending along a horizontal direction parallel to the surface of the circuit board and configured for the at least one fixing element to pass through along an inserting direction perpendicular to the horizontal direction to assemble the circuit board to the case, a size of the at least one first slot allows the at least one fixing element to move in the at least one first slot along the horizontal direction thereof, wherein the electronic connector comprises a nut for rotating along a fastening direction after receiving a force, the nut rotates along the fastening direction, the case rotates with the nut along the fastening direction, and the at least one fixing element moves around the electronic connector as a center in the at least one first slot.

8. The electronic device as recited in claim 7, wherein the case further comprises an installation portion disposed at the case body, the electronic connector comprises a body, a supporting portion located at one end of the body, a connection port located at the other end of the body, a threaded portion disposed at the body, a nut screwed on the threaded portion, and a sealing ring disposed at the supporting portion, the supporting portion is held between the circuit board and the installation portion, the sealing ring is held between the supporting portion and the installation portion, and the installation portion is held between the nut and the supporting portion.

9. A circuit board module for being assembled to a case, the circuit board module comprising:
   an electronic connector; and
   a circuit board, wherein the electronic connector is fixed to the circuit board, the circuit board has at least one first slot extending along a horizontal direction and configured for a fixing element to pass through along an inserting direction perpendicular to the horizontal direction to assemble the circuit board to the case, a size of the at least one first slot allows the fixing element to move in the at least one first slot along the horizontal direction thereof, wherein the fixing element passes through the first slot and is fixed to the case so that the circuit board is assembled to the case, and the case is adapted to rotate with respect to the circuit board by a certain angle so that the fixing element is adapted to move in the first slot along the horizonal direction.

10. An electronic device comprising:
    a case comprising:
    a case body;
    at least one fixing portion disposed at the case body; and
    at least one fixing element fixed to the fixing portion; and
    a circuit board module comprising:

an electronic connector; and a circuit board, wherein the electronic connector is fixed to the circuit board, the circuit board is connected to the case body and has at least one first slot extending along a horizontal direction and configured for the at least one fixing element to pass through along an inserting direction perpendicular to the horizontal direction to assemble the circuit board to the case, a size of the at least one first slot allows the at least one fixing element to move in the at least one first slot along the horizontal direction thereof, wherein the fixing element passes through the first slot and is fixed to the case so that the circuit board is assembled to the case, and the case is adapted to rotate with respect to the circuit board by a certain angle so that the fixing element is adapted to move in the first slot along the horizonal direction.

* * * * *